United States Patent
Hu et al.

(10) Patent No.: US 12,196,833 B2
(45) Date of Patent: Jan. 14, 2025

(54) METHOD AND SYSTEM FOR ACCELERATED ACQUISITION AND ARTIFACT REDUCTION OF UNDERSAMPLED MRI USING A DEEP LEARNING BASED 3D GENERATIVE ADVERSARIAL NETWORK

(71) Applicants: Siemens Healthineers AG, Forchheim (DE); The Regents of the University of California, Oakland, CA (US)

(72) Inventors: Peng Hu, Beverly Hills, CA (US); Xiaodong Zhong, Oak Park, CA (US); Chang Gao, Los Angeles, CA (US); Valid Ghodrati, Glendale, CA (US)

(73) Assignees: Siemens Healthineers AG, Forchheim (DE); The Regents of the University of California, Oakland, CA (US)

( * ) Notice: Subject to any disclaimer, the term of this patent is extended or adjusted under 35 U.S.C. 154(b) by 748 days.

(21) Appl. No.: 17/324,161

(22) Filed: May 19, 2021

(65) Prior Publication Data
US 2022/0381861 A1  Dec. 1, 2022

(51) Int. Cl.
*G01R 33/565* (2006.01)
*G01R 33/48* (2006.01)
(Continued)

(52) U.S. Cl.
CPC ......... *G01R 33/565* (2013.01); *G01R 33/482* (2013.01); *G01R 33/4824* (2013.01);
(Continued)

(58) Field of Classification Search
CPC .............. G01R 33/482; G01R 33/4824; G01R 33/4826; G01R 33/5608; G01R 33/561;
(Continued)

(56) References Cited

U.S. PATENT DOCUMENTS 10,902,651 B2 *  1/2021  Huang ................... G06N 20/00
11,842,498 B2 * 12/2023  Laaksonen ................ G06T 7/12
(Continued)

OTHER PUBLICATIONS

Lv et al., "PIC-GAN: A Parallel Imaging Coupled Generative Adversarial Network for Accelerated Multi-Channel MRI Reconstruction", Diagnostics 2021, 11, 61, pp. 1-15 (Year: 2021).*
(Continued)

*Primary Examiner* — Ping Y Hsieh
*Assistant Examiner* — Jose M Torres

(57) ABSTRACT

Systems and methods for generative adversarial networks (GANs) to remove artifacts from undersampled magnetic resonance (MR) images are described. The process of training the GAN can include providing undersampled 3D MR images to the generator model, providing the generated example and a real example to the discriminator model, applying adversarial loss, L2 loss, and structural similarity index measure loss to the generator model based on a classification output by the discriminator model, and repeating until the generator model has been trained to remove the artifacts from the undersampled 3D MR images. At runtime, the trained generator model of the GAN can be generate artifact-free images or parameter maps from undersampled MRI data of a patient.

17 Claims, 15 Drawing Sheets

(51) Int. Cl.
  *G01R 33/56* (2006.01)
  *G06F 18/2132* (2023.01)
  *G06N 20/00* (2019.01)
(52) U.S. Cl.
  CPC ..... *G01R 33/5608* (2013.01); *G06F 18/2132* (2023.01); *G06N 20/00* (2019.01)
(58) Field of Classification Search
  CPC .. G01R 33/565; G06F 18/2132; G06N 3/045; G06N 3/0475; G06N 3/088; G06N 20/00; G06N 33/5676
  See application file for complete search history.

(56) References Cited

U.S. PATENT DOCUMENTS

| | | | | |
|---|---|---|---|---|
| 2007/0096732 | A1* | 5/2007 | Samsonov | G01R 33/5611 324/309 |
| 2019/0108634 | A1* | 4/2019 | Zaharchuk | G06T 5/002 |
| 2019/0128989 | A1* | 5/2019 | Braun | G06N 3/047 |
| 2019/0219654 | A1* | 7/2019 | Park | G01R 33/56554 |
| 2019/0369191 | A1* | 12/2019 | Gong | A61B 5/055 |
| 2020/0090382 | A1* | 3/2020 | Huang | G06N 3/084 |
| 2020/0372297 | A1* | 11/2020 | Terjek | G06N 3/047 |
| 2021/0158583 | A1* | 5/2021 | Huang | G06T 11/005 |
| 2021/0183070 | A1* | 6/2021 | Laaksonen | A61N 5/1048 |
| 2021/0199743 | A1* | 7/2021 | Yap | G01R 33/56341 |
| 2021/0217213 | A1* | 7/2021 | Cole | G06N 3/088 |
| 2021/0287780 | A1* | 9/2021 | Korani | G06N 3/045 |
| 2022/0026514 | A1* | 1/2022 | Chen | G01R 33/5608 |
| 2022/0139003 | A1* | 5/2022 | Zhu | G06F 18/214 382/131 |

OTHER PUBLICATIONS

Block KT, Chandarana H, Milla S, et al. Towards Routine Clinical Use of Radial Stack-of-Stars 3D Gradient-Echo Sequences for Reducing Motion Sensitivity. J Korean Soc Magn Reson Med. 2014; 18(2):87. doi:10.13104/jksmrm.2014.18.2.87.

Fujinaga Y, Kitou Y, Ohya A, et al. Advantages of radial volumetric breath-hold examination (VIBE) with k-space weighted image contrast reconstruction (KWIC) over Cartesian VIBE in liver imaging of volunteers simulating inadequate or no breath-holding ability. Eur Radiol. 2016;26(8):2790-2797. doi:10.1007/s00330-015-4103-7.

Armstrong T, Dregely I, Stemmer A, et al. Free-breathing liver fat quantification using a multiecho 3D stack-of-radial technique: Free-Breathing Radial Liver Fat Quantification. Magn Reson Med. 2018;79(1):370-382. doi: 10.1002/mrm.26693.

Zhong X, Hu HH, Armstrong T, et al. Free-Breathing Volumetric Liver R2* and Proton Density Fat Fraction Quantification in Pediatric Patients Using Stack-of-Radial MRI With Self-Gating Motion Compensation. J Magn Reson Imaging. Published online Jun. 2020:jmri.27205. doi:10.1002/jmri.27205.

Feng L, Grimm R, Block KT, et al. Golden-angle radial sparse parallel MRI: Combination of compressed sensing, parallel imaging, and golden-angle radial sampling for fast and flexible dynamic volumetric MRI: iGRASP: Iterative Golden-Angle RAdial Sparse Parallel MRI. Magn Reson Med. 2014;72(3):707-717. doi:10.1002/mrm.24980.

Chandarana H, Feng L, Block TK, et al. Free-Breathing Contrast-Enhanced Multiphase MRI of the Liver Using a Combination of Compressed Sensing, Parallel Imaging, and Golden-Angle Radial Sampling: Investigative Radiology. 2013;48(1):10-16. doi:10.1097/RLI.0b013e318271869c.

Sun J, Li H, Xu Z. Deep ADMM-Net for compressive sensing MRI. InAdvances in neural information processing systems 2016 (pp. 10-18).

Mardani M, Gong E, Cheng JY, et al. Deep Generative Adversarial Neural Networks for Compressive Sensing MRI. IEEE Trans Med Imaging. 2019;38(1):167-179. doi:10.1109/TMI.2018.2858752.

Wu Y, Ma Y, Capaldi DP, et al. Incorporating prior knowledge via volumetric deep residual network to optimize the reconstruction of sparsely sampled MRI. Magnetic Resonance Imaging. 2020;66:93-103. doi: 10.1016/j.mri.2019.03.012.

Han Y, Yoo J, Kim HH, Shin HJ, Sung K, Ye JC. Deep learning with domain adaptation for accelerated projection-reconstruction MR. Magnetic resonance in medicine. Sep. 2018;80(3):1189-205.

Hauptmann A, Arridge S, Lucka F, Muthurangu V, Steeden JA. Real-time cardiovascular MR with spatio-temporal artifact suppression using deep learning-proof of concept in congenital heart disease. Magn Reson Med. 2019;81(2):1143-1156. doi:10.1002/mrm.27480.

Grimm R, Block KT, Hutter J, Forman C, Hintze C, Kiefer B, Hornegger J. Self-gating reconstructions of motion and perfusion for free-breathing T1-weighted DCE-MRI of the thorax using 3D stack-of-stars GRE imaging. Proc. Intl. Soc. Mag. Reson. Med. 20, 2012. p. 598.

Zhong X, Armstrong T, Nickel MD, et al. Effect of respiratory motion on free-breathing 3D stack-of-radial liver R2* relaxometry and improved quantification accuracy using self-gating. Magn Reson Med 2020;83:1964-1978.

Gao, C. et al., Undersampling Artifact Reduction for Free-Breathing 3D Stack-Of-Radial MRI Based on Deep Adversarial Learning Network, ISMRM (May 15-20, 2021).

* cited by examiner

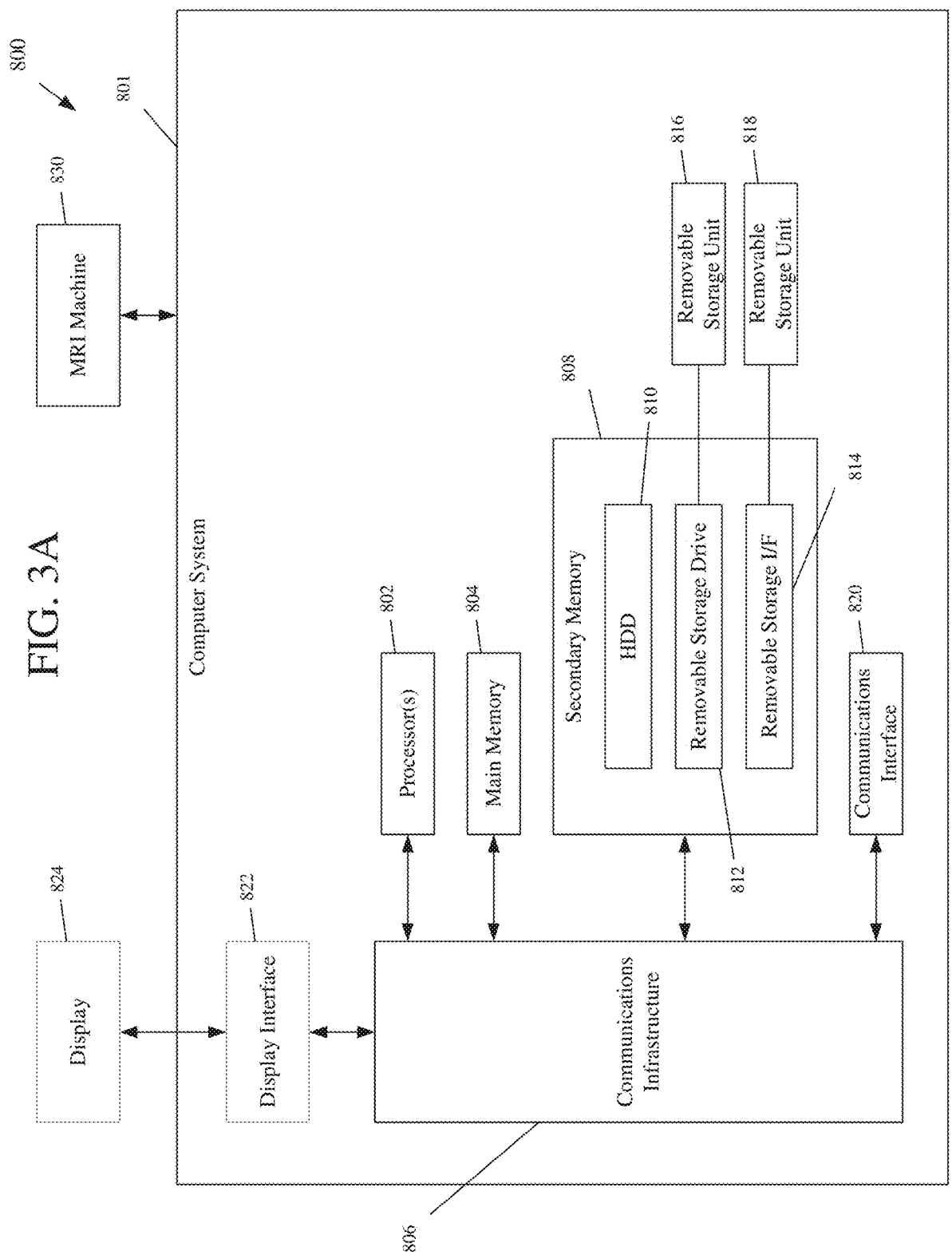

5 epochs 10 epochs 25 epochs 40 epochs

METHOD AND SYSTEM FOR ACCELERATED ACQUISITION AND ARTIFACT REDUCTION OF UNDERSAMPLED MRI USING A DEEP LEARNING BASED 3D GENERATIVE ADVERSARIAL NETWORK

BACKGROUND

Many magnetic resonance imaging (MRI) techniques require that the patient being imaged hold their breath during the scan, particularly for abdominal imaging. However, breath-hold MRI techniques are not suitable for all types of patients, including pediatric patients, elderly patients, patients with disabilities, patients with neurological disorders, patients that are otherwise unable to comply with operator instructions. Accordingly, MRI techniques have been developed that allow patients to breathe freely during the MRI scan. Free-breathing MRI techniques can achieve volumetric coverage, high spatial resolution, and high signal-to-noise ratio for subjects with breath-hold difficulties. One of the promising techniques which enables the abdominal free-breathing scan is the self-gated 3D stack-of-radial MRI. However, to achieve good image quality and reduce the respiratory motion artifacts, self-gated stack-of-radial abdominal MRIs typically require a significant number of radial spokes to be acquired, which in turn results in a relatively long acquisition time compared to breath-hold techniques. Because these types of techniques require a long acquisition time, they are generally not practical for clinical use. Therefore, techniques for accelerating the acquisition time of free-breathing MRI in clinical applications would be highly beneficial.

One way to speed up the MRI acquisition time is to undersample the k-space data. When undersampling, one must be cognizant of the Shannon-Nyquist sampling theorem. In particular, when the signal frequency is higher than the Nyquist limit of the sampling rate, aliasing occurs. One of the practical approaches to accelerate the imaging process is violating the Shannon-Nyquist sampling theorem by acquiring fewer radial spokes and reconstructing the artifact-free images from the acquired spokes by using the prior condition, e.g., incoherency in the sampling pattern and redundant information in the temporal or channel direction of the data. Reconstruction methods such as parallel imaging (PI) and compressed sensing (CS) have been implemented to solve these issues. PI uses the redundant information from multiple receiver coils to solve the underdetermined reconstruction problem, but the hardware arrangement limits the acceleration factor. CS relies on incoherence to solve the underdetermined reconstruction problem and can potentially achieve a relatively high acceleration rate. However, the iterative reconstruction process of the CS-based approaches is computationally intensive and requires non-trivial parameter tuning, which hinders its wide clinical use. Therefore, neither PI nor CS are completely suitable for accelerating the acquisition time of free-breathing MRI in clinical applications.

Recent research has indicated that deep neural networks have potential for image reconstruction and image artifact reduction. Streaking artifact reduction is one of the most successful applications using deep learning. For example, Han et al., *Deep Learning With Domain Adaptation for Accelerated Projection-Reconstruction MR*, Magn Reson Med. 2018, 80:1189-1205, demonstrated that U-Net with domain adaptation from CT images could be used to restore high resolution MRI from undersampled radial data. Further, Hauptmann et al., *Real-Time Cardiovascular MR With Spatio-Temporal Artifact Suppression Using Deep Learning-Proof of Concept in Congenital Heart Disease*, Magn Reson Med. 2019, 81(2):1143-1156, demonstrated that a residual U-Net could be trained on synthetic radial MRI to suppress the spatial-temporal artifacts on real-time cardiovascular MR. However, the results of this research were demonstrated on synthetic radial MRI and lacked strong evaluation on paired real radial MRI. Further, currently known machine learning systems have not be shown to demonstrate adequate performance on de-streaking tasks using adversarial loss and pixel-wise loss. Streaking artifacts are high-frequency incoherent artifacts, which are inherently different from noise and aliasing artifacts. Removing streaking artifacts is particularly problematic because removing such artifacts may also remove the high-frequency image content at the same time. Therefore, machine learning-based systems and processes that are able to remove streaking artifacts and otherwise improve the quality of images obtained using stack-of-radial or other non-Cartesian trajectories or techniques would be highly beneficial.

SUMMARY

Described herein are systems and methods for removing or reducing artifacts within undersampled MRI data sets, including MR images, using GANs.

In one embodiment, the present disclosure is directed to a computer-implemented method for training a generator model of a GAN to remove artifacts from undersampled MRI data, the GAN comprising the generator model and a discriminator model, the method comprising: (a) obtaining, by a computer system, the undersampled 3D MRI data; (b) providing, by the computer system, the undersampled 3D MRI data to the generator model, wherein the generator model is configured to output a generated example in response thereto; (c) providing, by the computer system, the generated example and a real example to the discriminator model; (d) applying, by the computer system, adversarial loss, L2 loss, and structural similarity index measure loss to the generator model based on a classification output by the discriminator model; and (e) repeating, by the computer system, (a)—(d) until the generator model has been trained to remove the artifacts from the undersampled 3D MRI data.

In another embodiment, the present disclosure is directed to a computer system for training a generator model of a GAN to remove artifacts from undersampled MRI data, the GAN comprising the generator model and a discriminator model, the computer system comprising: a processor; and a memory coupled to the processor, the memory storing instructions that, when executed by the processor, cause the computer system to: (a) obtain the undersampled 3D MRI data; (b) provide the undersampled 3D MRI data to the generator model, wherein the generator model is configured to output a generated example in response thereto; (c) provide the generated example and a real example to the discriminator model; (d) apply adversarial loss, L2 loss, and structural similarity index measure loss to the generator model based on a classification output by the discriminator model; and (e) repeat (a)—(d) until the generator model has been trained to remove the artifacts from the undersampled 3D MRI data.

FIGURES

The accompanying drawings, which are incorporated in and form a part of the specification, illustrate the embodiments of the invention and together with the written description serve to explain the principles, characteristics, and features of the invention. In the drawings:

FIG. 3A is a block diagram of a medical imaging system, in accordance with at least one aspect of the present disclosure.

DESCRIPTION

This disclosure is not limited to the particular systems, devices and methods described, as these may vary. The terminology used in the description is for the purpose of describing the particular versions or embodiments only, and is not intended to limit the scope.

As used herein, the terms "algorithm," "system," "module," or "engine," if used herein, are not intended to be limiting of any particular implementation for accomplishing and/or performing the actions, steps, processes, etc., attributable to and/or performed thereby. An algorithm, system, module, and/or engine may be, but is not limited to, software, hardware and/or firmware or any combination thereof that performs the specified functions including, but not limited to, any use of a general and/or specialized processor in combination with appropriate software loaded or stored in a machine readable memory and executed by the processor. Further, any name associated with a particular algorithm, system, module, and/or engine is, unless otherwise specified, for purposes of convenience of reference and not intended to be limiting to a specific implementation. Additionally, any functionality attributed to an algorithm, system, module, and/or engine may be equally performed by multiple algorithms, systems, modules, and/or engines, incorporated into and/or combined with the functionality of another algorithm, system, module, and/or engine of the same or different type, or distributed across one or more algorithms, systems, modules, and/or engines of various configurations.

As used herein, the terms "MRI sequence," "pulse sequence," or "MRI pulse sequence" are interchangeable and can include a particular combination of pulse sequences and/or pulsed field gradients that result in a particular set of MRI data. An MRI sequence can be used either individually or in combination with one or more other MRI sequences (i.e., multi-parametric MRI).

As used herein, the term "MRI data" can include an MRI image or any other data obtained via MRI (e.g., biomarker data or a parameter map). An MRI image can include a three-dimensional image or a two-dimensional image (e.g., a slice of a three-dimensional image).

Accelerated Acquisition and Artifact Reduction of Undersampled MRI Using a GAN

Figure 1:
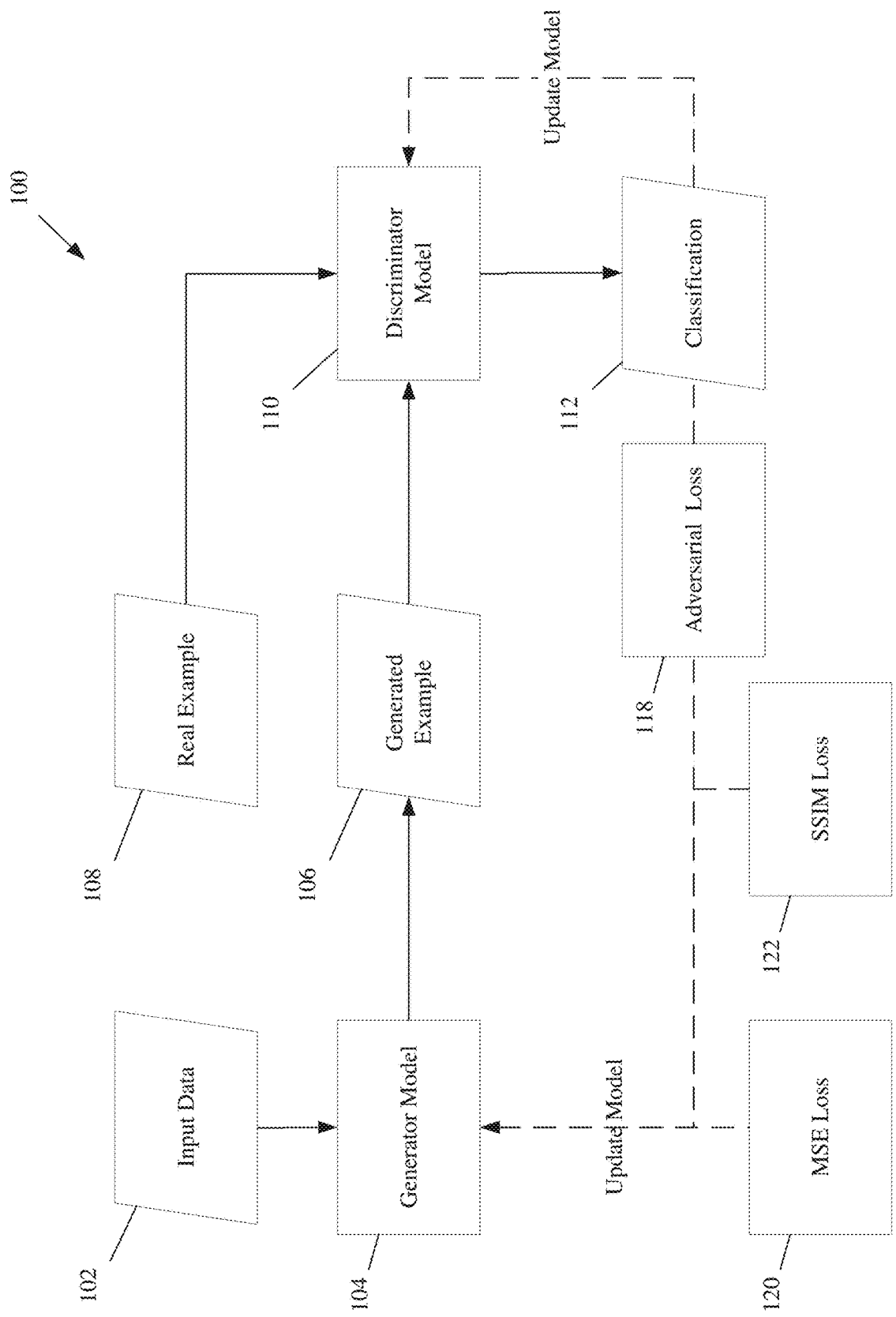
FIG. 1 is a block diagram of the general architecture of a GAN, in accordance with at least one aspect of the present disclosure.

This disclosure is generally directed to computer-implemented methods and systems for training and implementing a GAN to accelerate the acquisition of and reduce artifacts present within undersampled MRI. As shown in FIG. 1, a GAN 100 includes a generator model 104 and a discriminator model 110 that attempts to discriminate between a real example 108 and a generated example 106 created by the generator model 104. In particular, the generator model 104 receives an input 102 and then creates a generated example 106 accordingly. The generated examples 106 and/or real examples 108 are provided to the discriminator model 110, which accordingly makes a classification 112 for each of the received examples as either real or fake (i.e., generated by the generator model 104). Based on the results of the classification 112, the generator model 104 and/or discriminator model 110 are updated accordingly in a dynamic manner (e.g., via the application of adversarial loss 118). In various implementations, the generator model 104 is rewarded for fooling the discriminator model 110, the generator model 104 is penalized for creating a generated example 106 that is correctly classified by the discriminator model 110, the discriminator model 110 is penalized for incorrectly classifying a generated example 106 as real, and so on. In this way, the generator model 104 is indirectly trained by being trained to generate examples 106 that fool the discriminator model 110, which allows for unsupervised learning. The generator model 104 and/or discriminator model 110 could include convolutional neural networks (CNNs) and they could be designed to work with image data, for example.

Stated different, the GAN 100 includes a generator network G and a discriminator network D. The generator G tried to imitate the distribution of a reference dataset x with the input of artifact contaminated images $x_u$. The discriminator D aimed to distinguish between the real artifact-free images x and the synthesized fake images $G(x_u)$. The adversarial setting was a competing process between the generator $G_{\theta_G}(x_u): x_u \mapsto x$ and the discriminator $D_{\theta_D}(x): x \mapsto [0,1]$, where $\theta_G$ and $\theta_D$ are the parameters of networks G and D, respectively.

Figure 2:
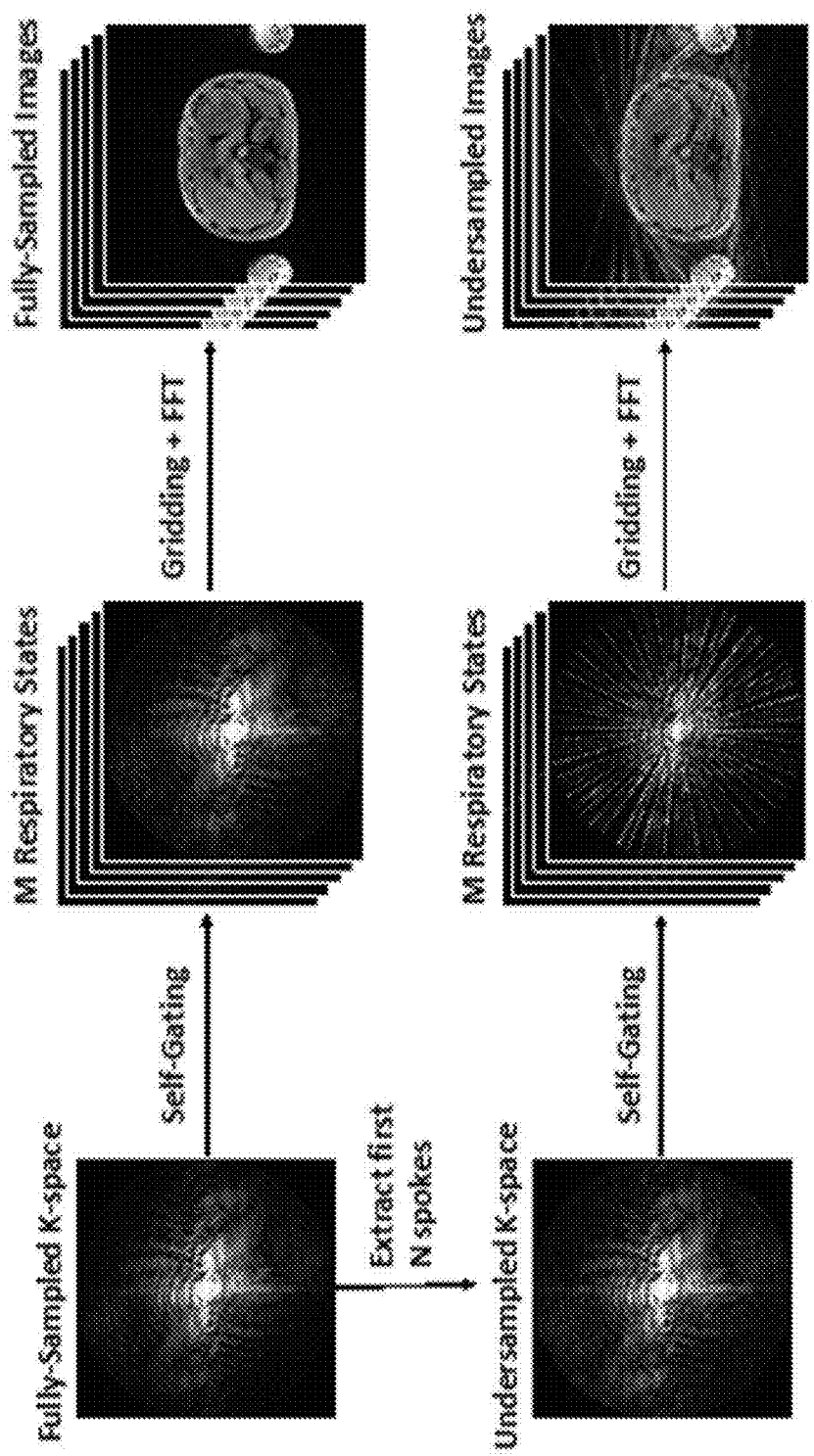
FIG. 2 is a block diagram for an illustrative undersampling framework, in accordance with at least one aspect of the present disclosure.
Figure 3B:
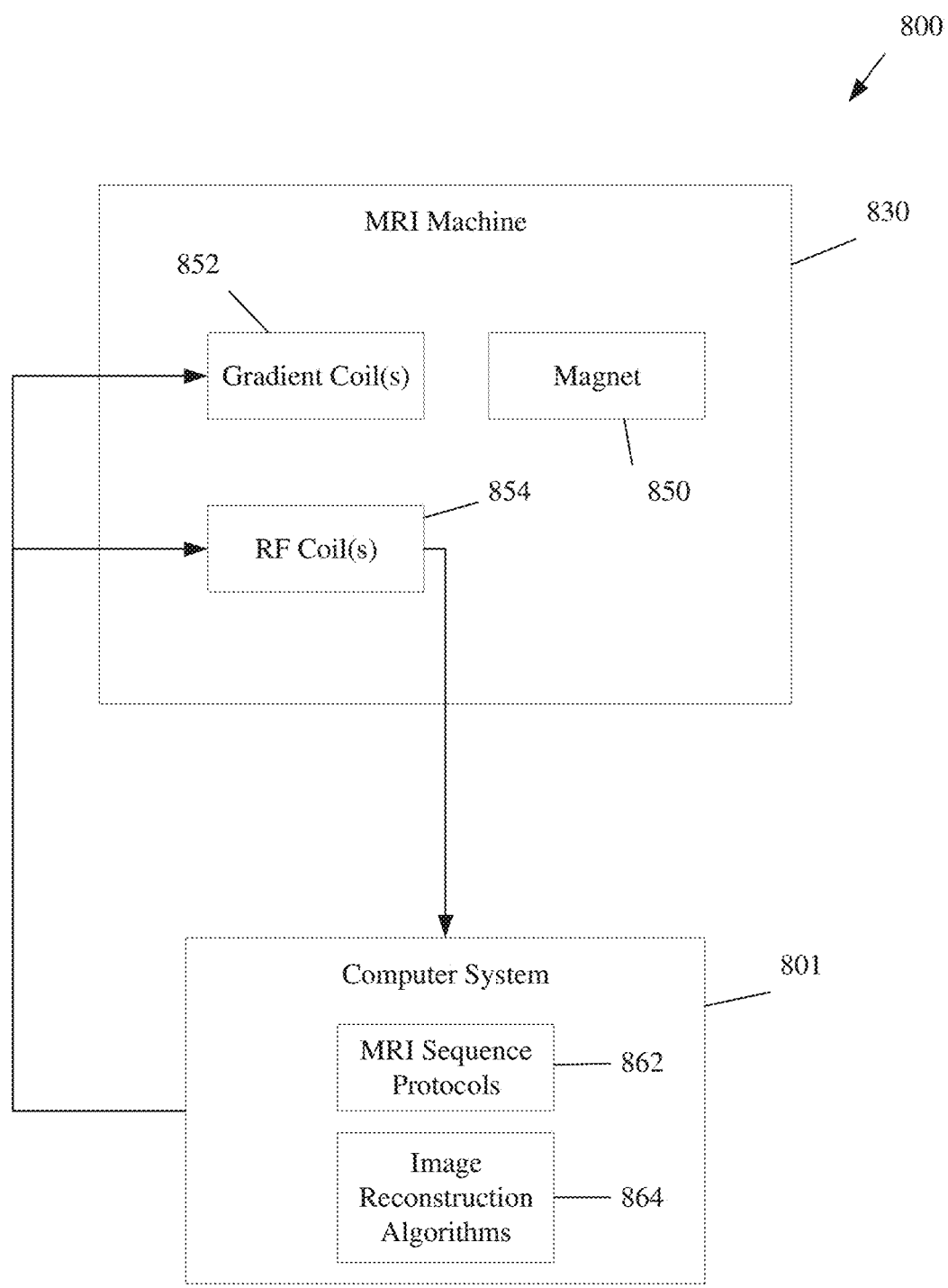
FIG. 3B is a second block diagram of the medical imaging system shown in FIG. 3A, in accordance with at least one aspect of the present disclosure.

In one particular implementation, the GAN 100 can be trained on input data 102 that includes 3D MRI data, particularly undersampled 3D MRI data. This training technique represents a first departure from conventional training techniques because GANs are typically used for processing 2D data. In one embodiment, the 3D MRI data could be undersampled during runtime of the medical imaging system (FIGS. 3A and 3B). In another embodiment, 3D MRI data could be retrospectively undersampled in order to generate training data, validation data, and/or other data for the GAN 100. FIG. 2 illustrates an illustrative undersampling framework. As can be seen, the raw 3D MRI data could be processed through a k-space undersampling algorithm to generate the input data 102 for the GAN 100. Further, the raw 3D MRI data could further be maintained to serve as the real examples 108 provided to the discriminator model 110 during training. In this framework, undersampling was performed by extracting specified number of spokes from the fully-sampled data. The fully-sampled and undersampled data were sorted into M respiratory states using self-gating and gridding followed by Fourier Transform (FFT).

During training of a GAN 100, adversarial loss 118 is typically applied to the generator model 104 based on the classification 112 output by the discriminator model 110. However, the GAN 100 described herein applies additional loss functions to the generator model 104 to further constrain the output of the generator model 104. In one embodiment, the GAN 100 further is programmed to apply a mean squared error (MSE) loss function 120 (i.e., L2 loss) and a structural similarity index measure (SSIM) loss function 122 to the generator model 122. As described in greater detail in the examples below, the application of the combination of adversarial loss 118 from the discriminator model classification 112, L2 loss 120, and SSIM loss 122 to the generator model 104 caused the trained generator model 104 to demonstrate unexpectedly improved performance in removing artifacts from the undersampled 3D MRI data. Accordingly, the combination of the three types of loss functions 118, 120, 122 allowed the system to constrain the anatomy and preserve image sharpness. In various embodiments, the artifacts that the generator model 104 can be trained to remove from undersampled 3D MRI data can include, for example, streaking, aliasing, and ghosting.

The training process of a general GAN can be mathematically formulated as a minmax optimization problem to find the optimal network parameters $\theta_G$ and $\theta_D$:

$$\min_{\theta_G} \max_{\theta_D} \mathcal{L}_{GAN}(\theta_G, \theta_D) =$$
$$\mathbb{E}_{x \sim p_{train}(x)}\left[\log D_{\theta_D}(x)\right] + \mathbb{E}_{x_u \sim p_G(x_u)}\left[\log\left(1 - D_{\theta_D}(G_{\theta_G}(x_u))\right)\right]$$

where $\mathbb{E}[\cdot]$ is the expectation operator. To solve this equation, the gradients are optimized alternatively between the generator and the discriminator. In one embodiment, the adversarial loss 118 can imitate the distributions of the reference images, but may cause anatomical mismatch by overemphasizing the high frequency texture and ignoring the image content. To compensate for this issue, the GAN 100 additionally includes the pixel-wise MSE loss 120 and the SSIM loss 122 to constrain the output of the generator model 104. The MSE loss 120 aims at minimizing the Euclidian distance between the output and the reference. In one embodiment, the MSE loss 120 can be represented by the following function:

$$\min_{\theta_G} \mathcal{L}_{l_2}(\theta_G) = \left\| G_{\theta_G}(x_u) - x \right\|_2^2$$

where $\|\cdot\|_2$ denotes the L2 norm. The SSIM loss 122 promotes the similarities between the local patches of the output of the generator model 104 and the artifact-free images. In one embodiment, the SSIM loss 122 can be represented by the following function:

$$\min_{\theta_G} \mathcal{L}_{SSIM}(\theta_G) = -SSIM(x, G_{\theta_G}(x_u))$$

The SSIM(•) function is a model that is used to measure the similarity between two images and, thus, can be used to predict the perceived quality of images. In one embodiment, SSIM quality metrics is comprised of the multiplication of the three terms, including the luminance term L(•), contrast term C(•), and structural term S(•). In one embodiment, the SSIM per pixel/voxel between two 2D/3D images A and B can be formulated as:

$$SSIM(x,y) = [L(x,y)]^\alpha [C(x,y)]^\beta [S(x,y)]^\beta$$

where A and B are inputs to all functions, but they are omitted for the sake of clarity. x and y are the pixel/voxel intensity values from the input images. Further, in some embodiments, luminance, contrast, and structural terms can be defined as:

$$L(x, y) = \frac{2\mu_x\mu_y + C_1}{\mu_x^2 + \mu_y^2 + C_1}$$

$$C(x, y) = \frac{2\sigma_x\sigma_y + C_2}{\sigma_x^2 + \sigma_y^2 + C_2}$$

$$S(x, y) = \frac{\sigma_{xy} + C_3}{\sigma_x\sigma_y + C_3}$$

where μx, μy, σx, σy, and σxy are the local means, standard deviations, and cross-covariance. By combining the adversarial loss of the generator, L2 loss and SSIM loss, the total loss can be defined as:

$$\mathcal{L}_{TOTAL} = \alpha\mathcal{L}_G + \beta\mathcal{L}_{l_2} + \gamma\mathcal{L}_{SSIM}$$

where α, β, γ are the weights of each loss, respectively and α+β+γ=1. Additional discussion of the various loss functions can be found in Gao et al., which is discussed below.

In various embodiments, the undersampled 3D MRI data can be obtained via any MRI sequences, including spin echo (e.g., T1 or T2-weighted) or gradient echo (GRE) sequences. In various embodiments, the undersampled 3D MRI data can be obtained using a variety of different imaging trajectories, including Cartesian or non-Cartesian (e.g., radial, stack-of-radial, or spiral) trajectories. In various embodiments, the systems and techniques described herein could be used to remove artifacts from undersampled 3D MRI data to generate MR images or parameter maps for one or more biomarkers. The biomarkers could include, for example, proton density fat fraction (PDFF), R2, R2*, T1, or T2. For example, the systems and methods described herein could be utilized to train the generator model 104 to reduce the standard deviation of the measured values of the biomarkers inside the tissue, thereby increasing the precision of the measured tissue biomarker values. For example, the systems and methods described herein could be utilized to train the generator model 104 to maintain the consistency of the mean value of the measured values of the biomarkers inside the tissue, thereby increasing the accuracy of the measured tissue biomarker values. As another example, the systems and methods described herein could be utilized to train the generator model 104 to reduce both the mean value and the standard deviation of the measured values of the biomarkers inside the tissue, thereby increasing the precision of the measured tissue biomarker values in the background air. Further, the systems and techniques could be used for a variety of different applications, including elastography, for example.

Because the systems and techniques described herein are particularly adapted to reducing artifacts present within 3D MRI data, the techniques could be implemented within a medical imaging system (e.g., the medical imaging system 800 described below) to shorten the acquisition time for the MRI sequences. In particular, the medical imaging system 800 could implement an acceleration factor to undersample the 3D MRI data at acquisition, which in turn shortens the acquisition time. Although undersampled 3D MRI data is typically undesirable due to the artifacts that are introduced into the data, a generator model 104 trained using the systems and techniques described above could be executed by the medical imaging system 800 (e.g., the computer system 801) to "clean up" the undersampled 3D MRI data and remove the artifacts introduced thereto via the undersampling. Accordingly, a medical imaging system 800 executing such a generator model 104 could provide reduced acquisition times, without substantially affecting the output quality of the images and/or parameter maps generated therefrom.

Medical Imaging System Architecture

In some embodiments, the systems and techniques described above can be implemented in or by a medical imaging system, such as the medical imaging system 800 illustrated in FIGS. 3A and 3B.

FIG. 3A is an architecture diagram of medical imaging system 800 that may be used in some embodiments. As noted above, the medical imaging system 800 can include a computer system 801 and an imaging machine 830 (e.g., an MRI machine). The computer system 801 may include one or more processors 802. Each processor 802 is connected to a communication infrastructure 806 (e.g., a communications bus, cross-over bar, or network). The processor(s) 802 can include a CPU, a GPU, an AI accelerator, and/or a variety of other processor types. Computer system 801 may include a display interface 822 that forwards graphics, text, and other data from the communication infrastructure 806 (or from a frame buffer, not shown) for display on the display unit 824.

Computer system 801 may also include a main memory 804, such as a random access memory (RAM), and a secondary memory 808. The secondary memory 808 may include, for example, a hard disk drive (HDD) 810 and/or removable storage drive 812, which may represent a floppy disk drive, a magnetic tape drive, an optical disk drive, a memory stick, or the like as is known in the art. The removable storage drive 812 reads from and/or writes to a removable storage unit 816. Removable storage unit 816 may be a floppy disk, magnetic tape, optical disk, or the like. As will be understood, the removable storage unit 816 may include a computer readable storage medium having tangibly stored therein (embodied thereon) data and/or computer software instructions, e.g., for causing the processor(s) to perform various operations.

In alternative embodiments, secondary memory 808 may include other similar devices for allowing computer programs or other instructions to be loaded into computer system 801. Secondary memory 808 may include a removable storage unit 818 and a corresponding removable storage interface 814, which may be similar to removable storage drive 812, with its own removable storage unit 816. Examples of such removable storage units include, but are not limited to, USB or flash drives, which allow software and data to be transferred from the removable storage unit 816, 818 to computer system 801.

Computer system 801 may also include a communications interface 820. Communications interface 820 allows software and data to be transferred between computer system 801 and external devices. Examples of communications interface 820 may include a modem, Ethernet card, wireless network card, a Personal Computer Memory Card International Association (PCMCIA) slot and card, or the like. Software and data transferred via communications interface 820 may be in the form of signals, which may be electronic, electromagnetic, optical, or the like that are capable of being received by communications interface 820. These signals may be provided to communications interface 820 via a communications path (e.g., channel), which may be implemented using wire, cable, fiber optics, a telephone line, a cellular link, a radio frequency (RF) link and other communication channels.

In this document, the terms "computer program medium" and "non-transitory computer-readable storage medium" refer to media such as, but not limited to, media at removable storage drive 812, a hard disk installed in hard disk drive 810, or removable storage unit 816. These computer program products provide software to computer system 801. Computer programs (also referred to as computer control logic) may be stored in main memory 804 and/or secondary memory 808. Computer programs may also be received via communications interface 820. Such computer programs, when executed by a processor, enable the computer system 801 to perform the features of the methods discussed herein. For example, main memory 804, secondary memory 808, or removable storage units 816 or 818 may be encoded with computer program code (instructions) for performing operations corresponding to various processes disclosed herein.

Referring now to FIG. 3B, the MRI machine 830 can include a magnet 850 extending along a bore that is configured to receive a patient therein and that is configured to produce a generally uniform magnetic field, one or more gradient coils 852 that are configured to produce magnetic field gradients (e.g., linear gradients), and one or more RF coils 854 that are configured to transmit to RF signals to the patient's body and/or receive RF signals therefrom. The computer system 801 (embodiments of which are described in greater detail above) can store and implement calibration scan protocols 860, MRI sequences protocols 862, and/or image reconstruction algorithms 864, as well as a variety of other software modules known in the technical field. The MRI sequence protocols 862 can be embodied as instructions that, when executed by the computer system 801, cause the computer system 801 to control the gradient coils 852 and/or RF coils 854 to apply a particular sequence of magnetic field gradients and/or RF pulses to the patient. The image reconstruction algorithms 864 can be embodied as instructions that, when executed by the computer system 801, cause the computer system 801 to reconstruct an image of the patient based on the RF signal received from the patient (e.g., by the RF coils 854) as caused by the MRI sequence applied thereto. In one embodiment, the image reconstruction algorithms 864 could include a GAN 100 trained using the techniques described above to remove or reduce image artifacts from an undersampled MR image.

It is understood by those familiar with the art that the system described herein may be implemented in hardware, firmware, or software encoded (e.g., as instructions executable by a processor) on a non-transitory computer-readable storage medium.

EXAMPLES

Some examples will be provided to further illustrate application of the systems and techniques described herein. These examples are not intended to be limiting in any manner and, instead, are provided to elucidate the discussion herein.

In one example, a 3D free-breathing, golden-angle, stack-of-radial GRE MRI sequence was used to acquire multi-echo and single-echo images of fourteen healthy volunteers on two 3T MR scanners (including a MAGNETOM PrismaFit and a MAGNETOM Skyra, Siemens Healthcare, Erlangen, Germany). For the multi-echo images, six echoes were used with opposed/in phase arrangement and bipolar readout gradients, with echo times of 1.23, 2.46, 3.69, 4.92, 6.15, and 7.38 ms and a repetition time of 9 ms. A matrix size of 160×160 with 1500 radial spokes/partition were used with more subjects (1306 radial spokes/partition was used for a single subject) with a field of view of 450×450 mm$^2$, 64 slices, a slice thickness of 3.5 mm, a flip angle of 4°, and a bandwidth of 1080 Hz/pixel. For the single-echo images, all parameters were the same as the multi-echo images except that the matrix size was 256×256 with 3500 radial spokes/partition, an echo time of 1.23 ms, and a repetition time of 3 ms.

Referring back to FIG. 2, there is shown an illustrative retrospective undersampling framework implemented with the image reconstruction framework of the MRI scanner (Siemens Healthcare, Erlangen, Germany) and MATLAB (MathWorks, Natick, MA, USA). Batch script was performed to extract specified number of spokes from the fully-sampled data. In these examples, acceleration factors of 3.1×, 4.2× and 6.3× were selected to test the performance of the GAN. The radial spokes of the fully-sampled and undersampled data were subsequently grouped into 5 respiratory states using self-gating and then reconstructed. Datasets were randomly divided into three sets: the training set (consisting of the data from 8 subjects), the validation set (consisting of the data from 2 subjects), and the testing set (consisting of the data from 4 subjects).

Figure 4:
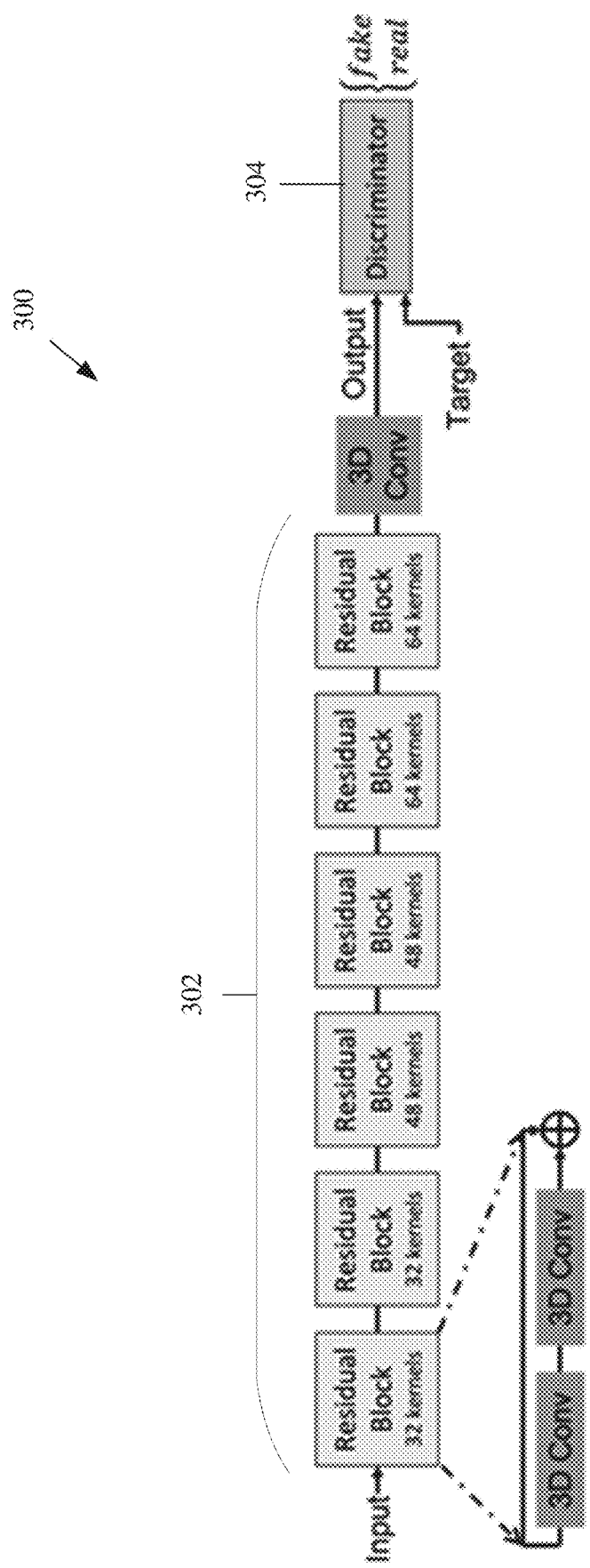
FIG. 4 is a block diagram of an illustrative GAN trained using the techniques described herein, in accordance with at least one aspect of the present disclosure.

A residual network was used for the generator model 104 as a parameter-efficient network architecture. Three separate residual GANs were trained for each acceleration factor, respectively. The general architecture of the GANs 300 is shown in FIG. 4. As can be seen, for each network, the generator model 302 included six residual blocks, each with two 3D convolution layers. Aside from adversarial loss, additional L2 (weight=0.6) and SSIM (weight=0.4) losses were applied to constrain the output of the generator model 302. The input data consisted of 64×64×64×2 complex image patches (real and imaginary) that were randomly cropped from the original 3D stacks, whereas the output and the target supplied to the discriminator model 304 were 3D magnitude images. The training of the GAN 300 was performed with the Pytorch interface on a commercially available GPU (NVIDIA Titan RTX, 24 GB RAM).

Figure 5:
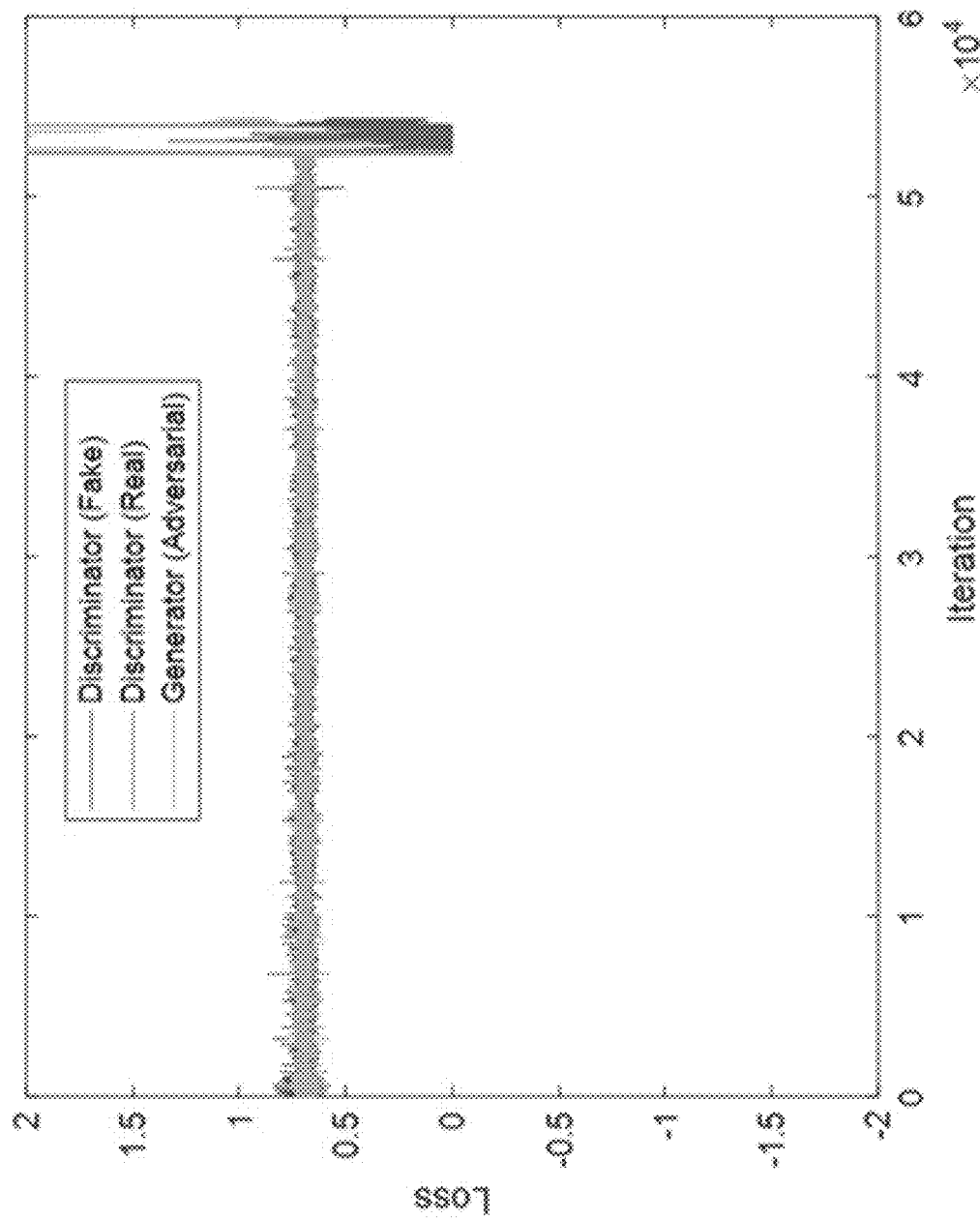
FIG. 5 is a plot of the adversarial loss over a number of training iterations for the generator model and the discriminator model for the GAN shown in FIG. 4, in accordance with at least one aspect of the present disclosure.
Figure 6:
FIG. 6 is a series of qualitative outputs of the GAN shown in FIG. 4 for validation cases over the training iterations, in accordance with at least one aspect of the present disclosure.
Figure 6:
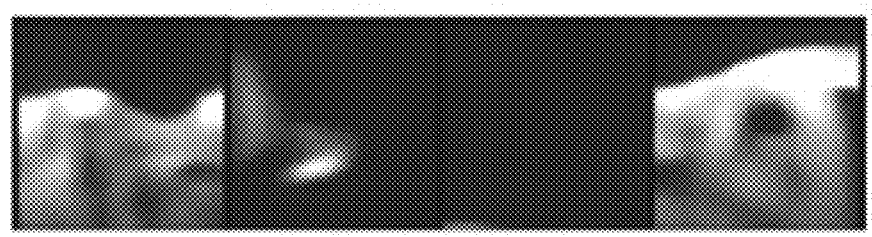
Figure 6:
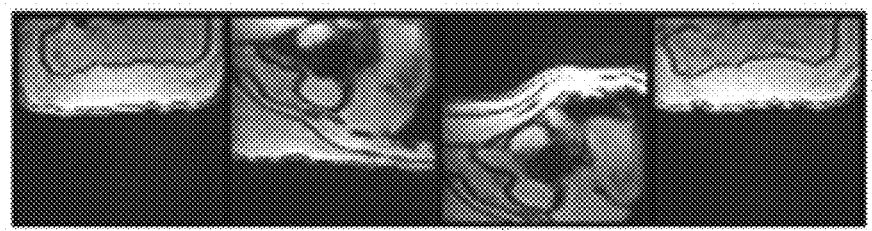
Figure 6:
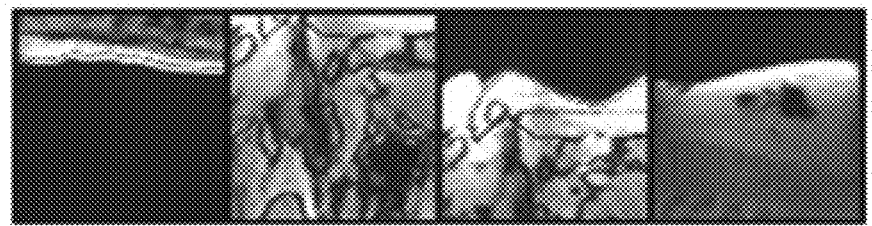

FIG. 5 shows the adversarial part of the loss function for the generator model 302 and the discriminator model 304 over the training iterations. As seen in FIG. 5, all three components oscillated around the equilibrium state (0.7). Further, FIG. 6 shows the qualitative output of the GAN 300 for validation cases over the iterations. In this particular implementation, the training was halted at epoch 30 because training the network for epochs 25-40 improved the image quality sufficiently.

Figure 7:
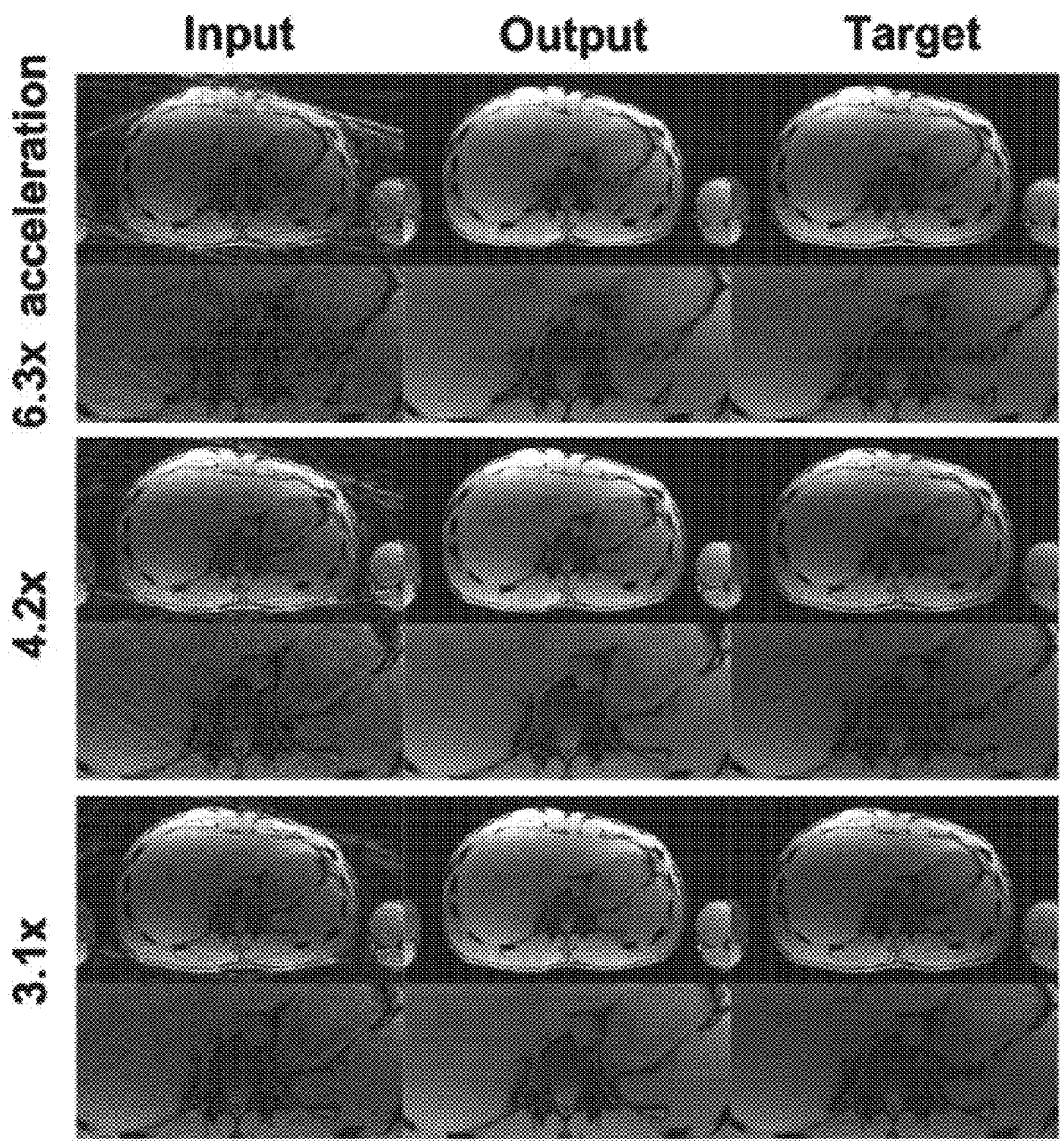
FIG. 7 is a series of qualitative results of the single-echo test data at various acceleration factors for the GAN shown in FIG. 4, in accordance with at least one aspect of the present disclosure.
Figure 8:
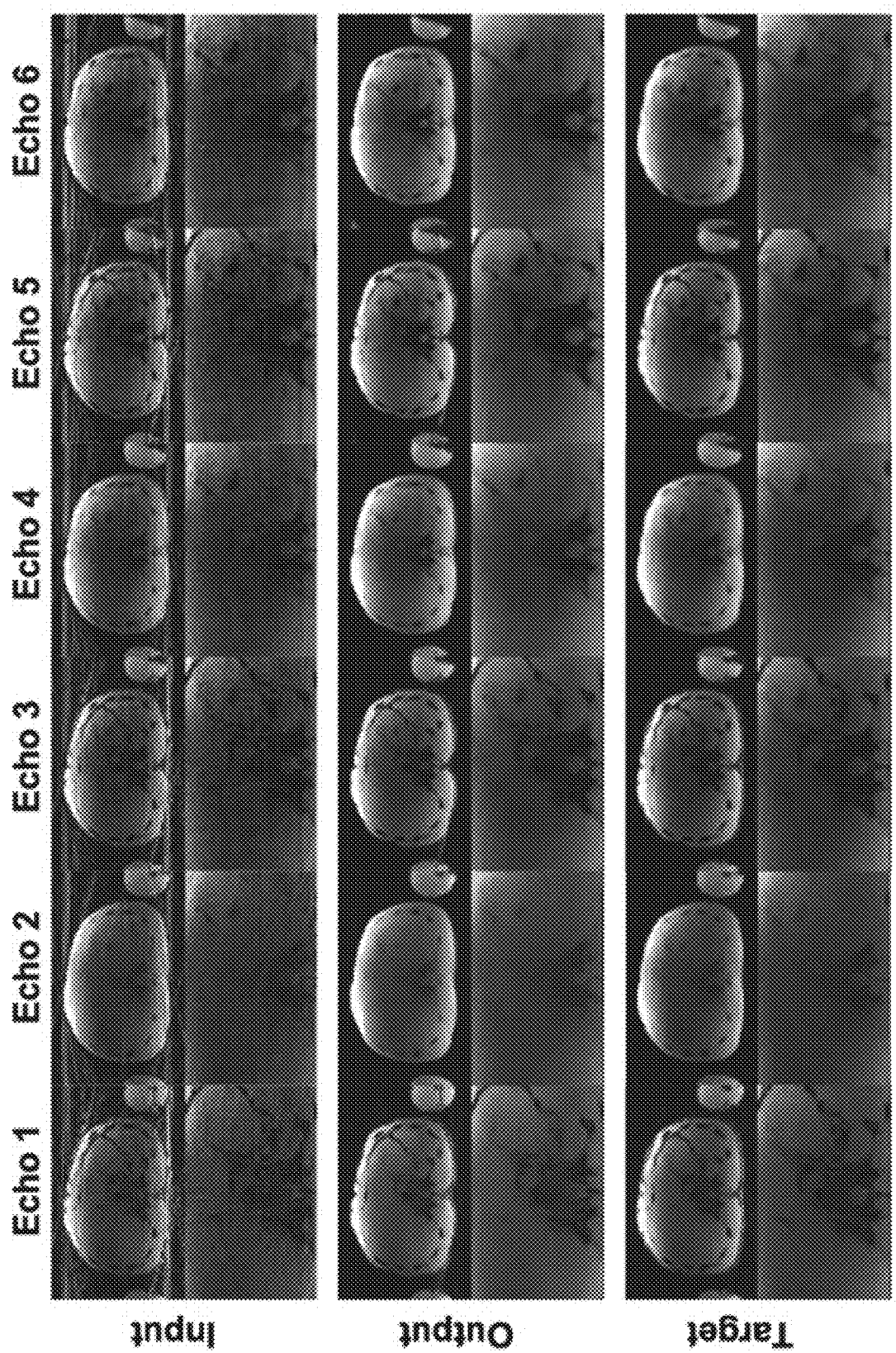
FIG. 8 is a series of qualitative results of the multi-echo test data at a particular acceleration factor for the GAN shown in FIG. 4, in accordance with at least one aspect of the present disclosure.

FIG. 7 shows qualitative results of the single-echo test data with 6.3× to 3.1× acceleration factors, which are indicated accordingly. The trained GANs 300 described herein successfully reduced streaking artifacts for all acceleration factors. The 6.3× accelerated images result in some blurriness compared to the ground truth. FIG. 8 shows qualitative results of the multi-echo test data for a 4.2× acceleration factor. Once again, the trained GANs 300 described herein successfully reduced streaking artifacts for six different echo times.

Figure 9:
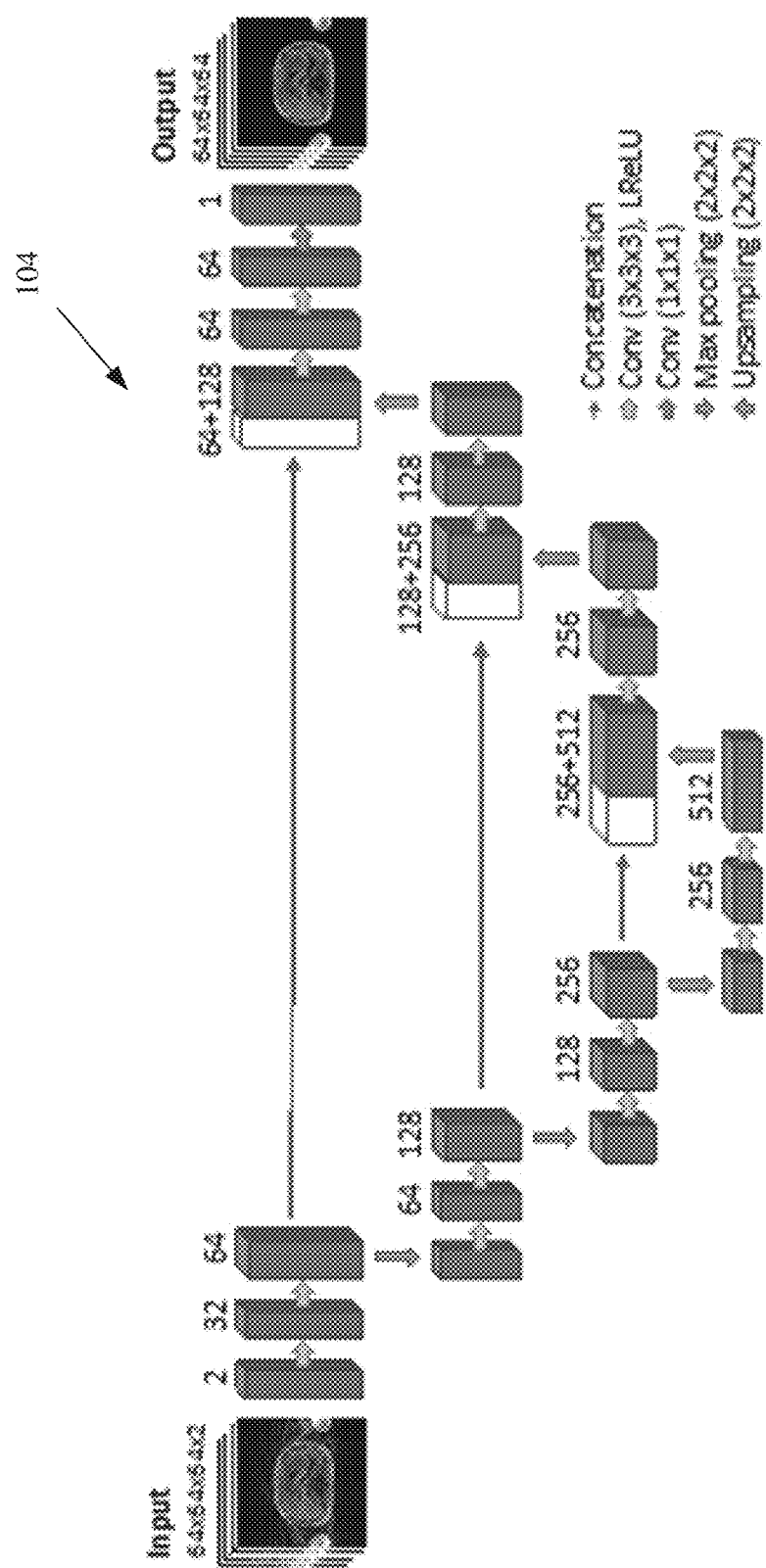
FIG. 9 is a block diagram of an illustrative generator model for a for a GAN, in accordance with at least one aspect of the present disclosure.
Figure 10:
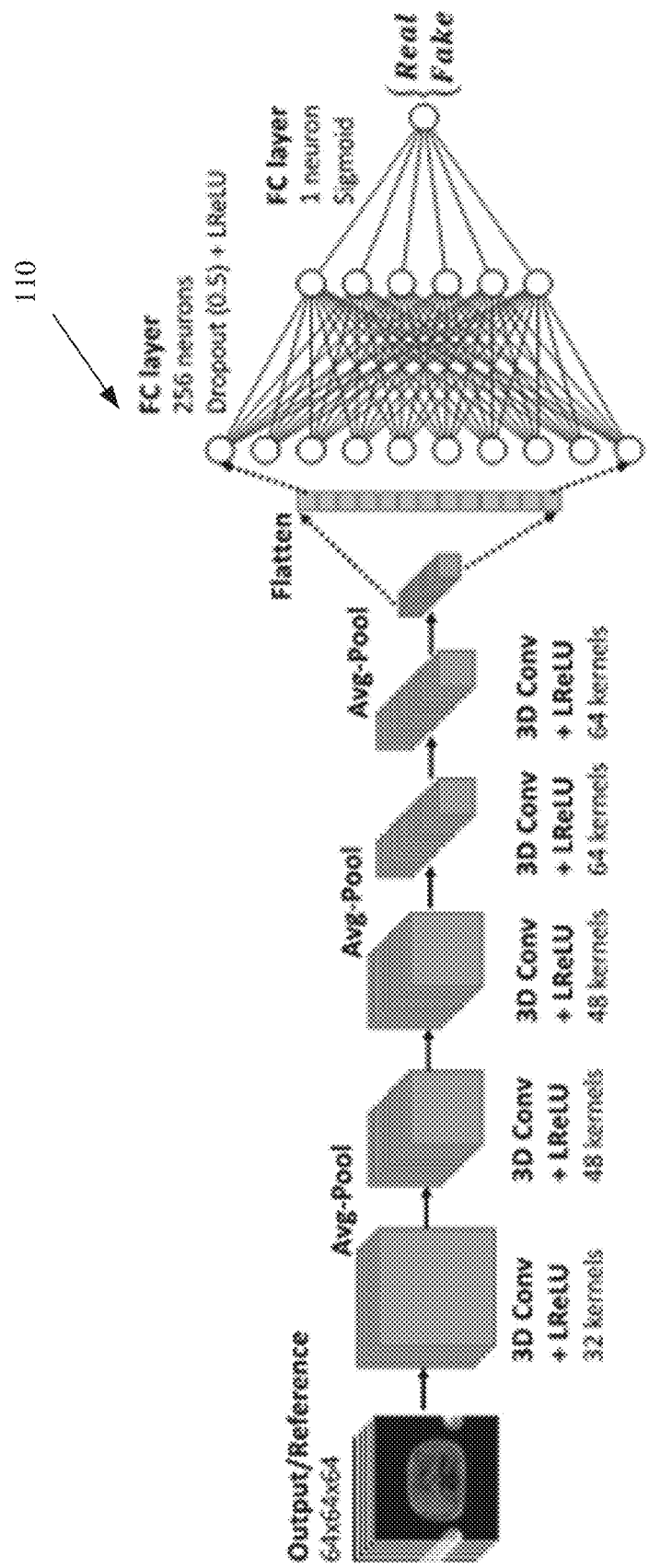
FIG. 10 is a block diagram of an illustrative discriminator model for a for a GAN, in accordance with at least one aspect of the present disclosure.

Referring now to FIGS. 8 and 9, there are shown illustrative architectures for the generator model 104 and the discriminator model 110, respectively. The number of channels for each layer are indicated therein. In this illustrative example, the complex input images are cropped to 64×64×64×2×$N_y$×$N_z$×$N_c$) patches before feeding into the network. The output and reference images are 64×64×64 magnitude images and are inputs of the discriminator model 110. The discriminator model 110 includes five 3×3×3 convolution layers and three average pooling layers to downsample the images followed by two fully-connected (FC) layers to classify the images as real or fake. In various implementations, different combinations of weights for the adversarial, MSE, and SSIM losses were used. In these particular examples, the weights for each training were: [α, β, γ]={[0.6, 0.2, 0.2], [0.4, 0.4, 0.2], [0.2, 0.6, 0.2]}, which are referred to as GAN 1, GAN 2 and GAN 3, respectively.

The datasets for training and validating the GAN included multi-echo and single-echo images obtained using a free-breathing 3D golden-angle stack-of-radial gradient echo sequence. To increase the size of the training and validation datasets, data augmentation techniques were used to extract and reconstruct five respiratory states, each consisting of approximately 20% of the total acquisition. Because the five respiratory states selected different radial spokes, the streaking artifacts appeared quite differently, which effectively enlarged the data size by five times. The five respiratory states were independently fed into the network and gave us 555 pairs of 3D complex images for training and 145 pairs of 3D complex images for validation. The images with matrix size of 256×256 had 80 spokes on average after self-gating and the images with matrix size of 160×160 had 50 spokes on average after self-gating, which was equivalent to five times acceleration. Respiratory gating of a 40% acceptance rate can achieve a good balance of motion artifact removal and scan efficiency and were used for the testing dataset. To investigate the generalization of the network on different acceleration factors, 3×, 4×, and 5× accelerations were applied on the testing dataset, which corresponded to 134, 100, and 80 spokes for matrix size of 256×256 and 84, 62, and 50 spokes for matrix size of 160×160, respectively. There was a total of 127 3D testing images for each acceleration used in these particular examples.

The network was trained with 100 epochs using an adaptive moment estimation optimization (Adam) algorithm with a momentum parameter β=0.9. A mini-batch training was performed with 16 batches per iteration. An initial learning rate was 0.0001 for the generator and an initial learning rate 0.00001 for the discriminator. We considered an exponential decay annealing procedure with a decay rate of 0.96 for every 2000 iterations. Weights for the networks were initiated with random normal distributions with a variance σ=0.01 and mean μ, =0. Implementation and training of the GAN was completed in Python version 3.5 using the Pytorch library version 1.4.030. The training and testing were performed on a commercially available graphics processing unit (NVIDIA Titan RTX, 24 GB memory). The total training time was 72 hours.

To evaluate the performance of the GAN, its was compared to a 3D U-Net with the same self-gated undersampled and fully-sampled data. The 3D U-Net had the same general structure as the generator, except with some adjustments to stabilize and optimize the network, including adding instance normalization layers before the convolutional layers and having two channel complex outputs. The MSE loss was used to train the 3D U-Net using an Adam optimizer with an initial learning rate of 0.01 (reducing with a factor of 0.7 if no improvement for 200 iterations) and maximum 100 epochs.

To investigate the generalization of the network trained on a specific acceleration factor to different acceleration factors, 3×, 4×, and 5× accelerated images were used to test the network trained only on 5× accelerated images. Different acceleration factors resulted in different extent of streaking artifacts in the image, but the streaking artifacts should have the same pattern and could be removed regardless of the acceleration rates. It was desirable to ascertain how well these models trained on one center could generalize to the unseen data from another center with different scan parameters and investigate the generalization of the network trained with diverse images of different image contrasts and different anatomies to images from a different imaging center. Accordingly, the network was tested on retrospectively acquired 2-point Dixon images (Dataset C) on a MR-PET scanner at another imaging center.

The performance of the proposed network compared to the input (undersampled gridding reconstruction) and U-Net was evaluated quantitatively and qualitatively. For quantitative evaluation, normalized MSE (NMSE) and SSIM metrics were calculated for three GANs, U-Net, and input with respect to the reference. Among all the testing cases in the abdomen, the pelvis, the thigh, and the leg, only the abdominal images of single-echo and multi-echo (echoes 1 and 2) were selected for quantitative ROI analysis and qualitative score evaluations. A total of 41 abdominal images from 16 subjects were selected for evaluation. Quantitative ROI analysis was conducted to compare the mean and standard deviation (SD) of the GAN, the U-Net, and the input with respect to the reference. Two ROIs in the background air and two ROIs inside the liver were selected for three representative slices (near-dome, mid-level, inferior liver). Mean and SD values were measured for the pixel intensities within each ROI.

Figure 11:
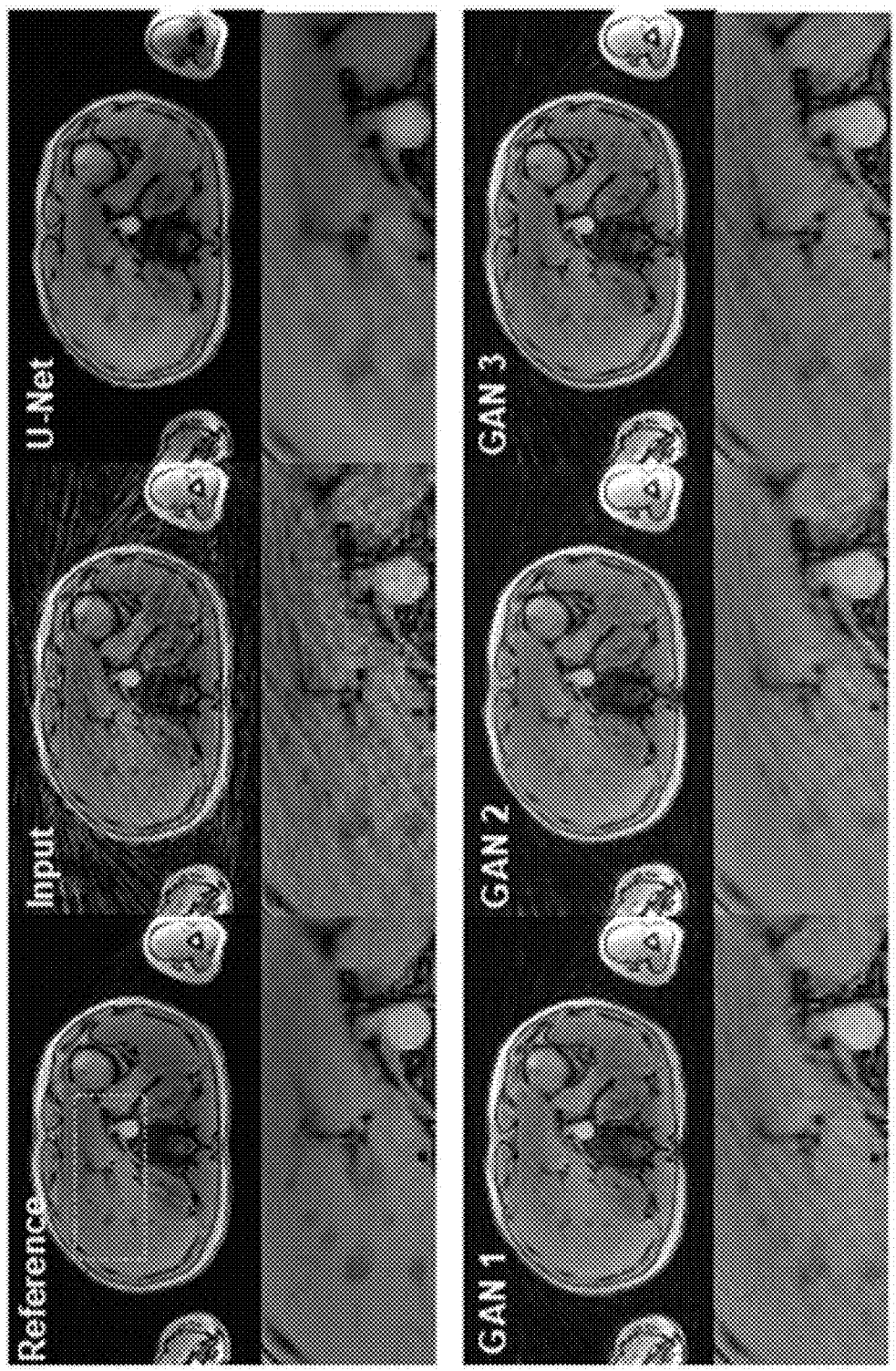
FIG. 11 is a set of images including 5× accelerated images of three GANs, U-Net, and the input compared to the reference, in accordance with at least one aspect of the present disclosure.
Figure 12:
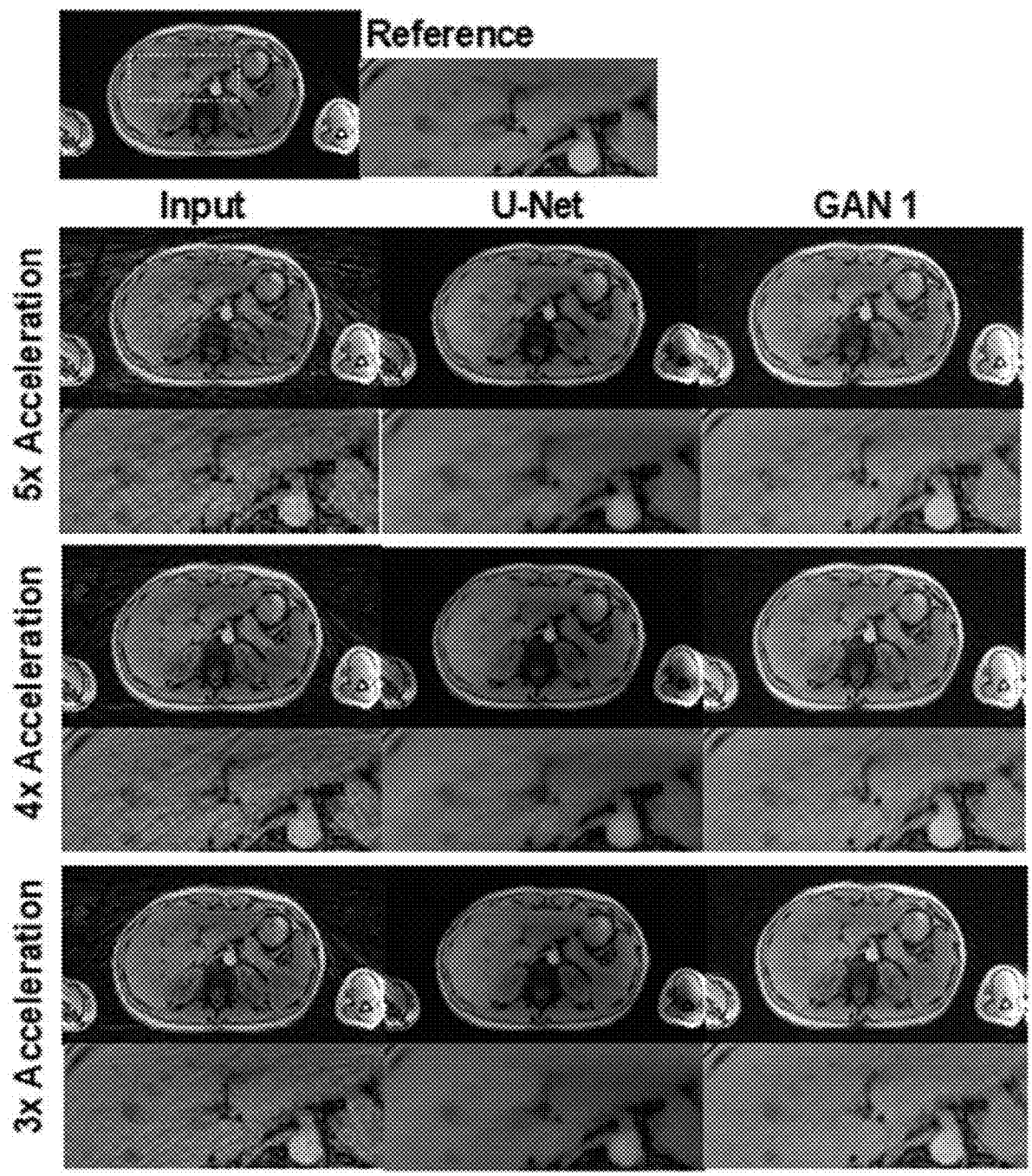
FIG. 12 is a set of images including the GAN 1, U-Net, and the input results compared to the reference for 3-5 times accelerations, in accordance with at least one aspect of the present disclosure.
Figure 13:
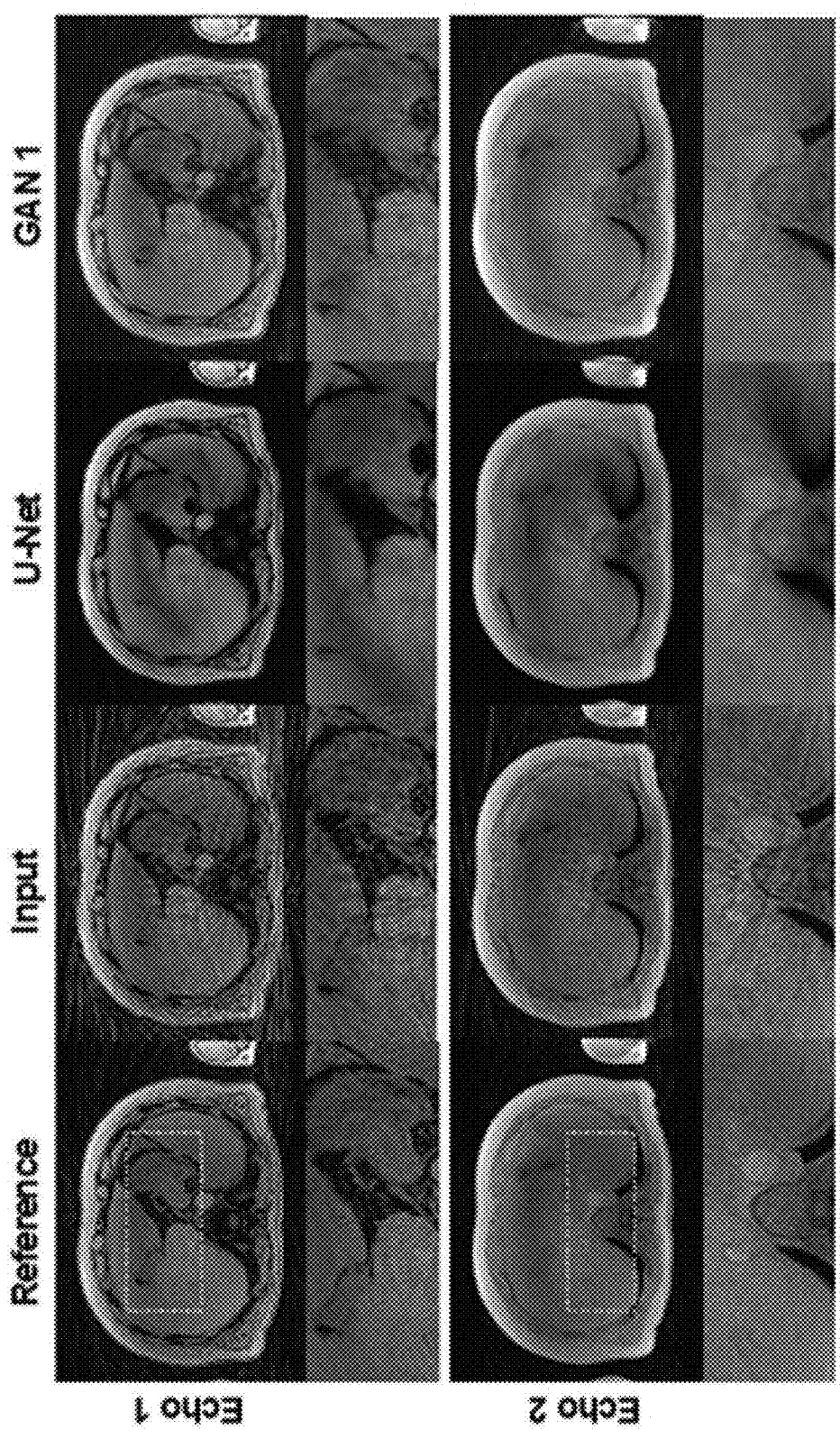
FIG. 13 is a set of images including 5× accelerated multi-echo images of a patient using the input, GAN 1, U-Net, and the reference, in accordance with at least one aspect of the present disclosure.
Figure 14:
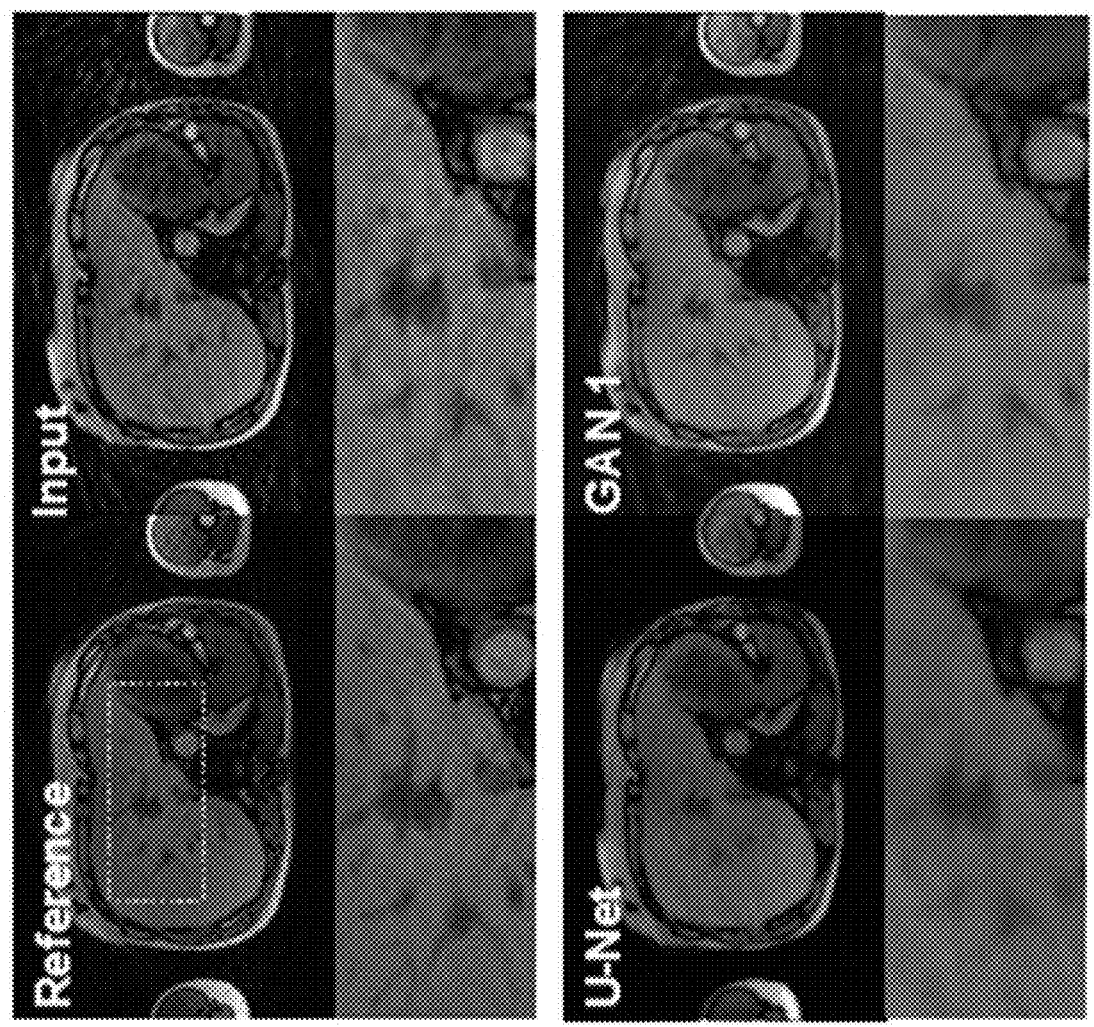
FIG. 14 is a set of images including indicating the performance of 5× accelerated GAN 1, U-Net, and the input compared to the reference on 2-point Dixon images, in accordance with at least one aspect of the present disclosure.

FIG. 11 shows an example of the 5× accelerated images of three GANs, U-Net, and the input compared to the reference. All three GANs and U-Net showed fewer streaking artifacts compared to input images. GANs preserved image sharpness compared to U-Net. The three GANs had similar performance and GAN 1 had slightly fewer streaking artifacts compared to the other two GANs. Therefore, GAN 1 was selected for the rest of the evaluations. FIG. 12 shows GAN 1, U-Net, and the input results compared to the reference for 3-5 times accelerations, corresponding to 134, 100 and 80 spokes per partition. GAN 1 and U-Net trained with 5× acceleration images successfully removed streaking artifacts for images with 3× and 4× accelerations. Consistent with 5× acceleration results, GAN 1 and U-Net had fewer streaking artifacts compared to input, while GAN 1 better preserved the image sharpness compared to U-Net. GAN 1 performance increased with lower acceleration factors, as indicated by the decreasing NMSE (5×: 0.066±0.033, 4×: 0.054±0.027, and 3×: 0.049±0.024) and increasing SSIM (5×: 0.84±0.05, 4×: 0.86±0.05, and 3×: 0.87±0.05). FIG. 13 shows an example of 5× accelerated multi-echo images of a patient using the input, GAN 1, U-Net, and the reference. For both in-phase and out-of-phase images, GAN 1 and U-Net had fewer streaking artifacts compared to input, while GAN 1 preserved better image sharpness compared to U-Net. FIG. 14 shows the performance of 5× accelerated GAN 1, U-Net, and the input compared to the reference on 2-point Dixon images acquired on a MR-PET scanner at another imaging center. Consistent with the results of same site images, GAN 1 and U-Net had fewer streaking artifacts compared to input and GAN 1 preserved image sharpness compared to U-Net.

In sum, the systems and processes described herein allow for the creation of a GAN that successfully reduces streaking and other artifacts resulting from undersampling of MRI data. Further, the described GAN removed streaking artifacts and showed superior performance in preserving image sharpness compared to deep neural networks based on pixel-wise loss. The golden-angle radial trajectory enabled flexible undersampling and self-gating strategies and resulted in incoherent streaking artifacts. Further, it can be beneficial to train the network using images with incoherent streaking artifacts to learn a wide variety of the streaking artifacts. This strategy may have contributed to the generalization of the network to various acceleration factors. Accordingly, the techniques described herein could be used to improve MRI data (e.g., images) exhibiting such artifacts. However, the techniques described herein could further be incorporated into a medical imaging system that is programmed to intentionally undersample the MRI data during scanning in order to speed up the MRI data acquisition process, which could mean that patients would have to spend less time within the MRI scanner bore and/or less time holding their breath for breath-hold imaging. The artifacts exhibited by the deliberately undersampled MRI data could then be redressed using the techniques described herein, thereby allowing to faster MRI data acquisition, without the disadvantageous presence of artifacts that would normally be present within MRI undersampled data.

Additional information regarding the techniques and results described herein can be found in Gao, C. et al., *Undersampling Artifact Reduction for Free-Breathing 3D Stack-Of-Radial MRI Based on Deep Adversarial Learning Network*, ISMRM (May 15-20, 2021), which is hereby incorporated by reference herein in its entirety.

While various illustrative embodiments incorporating the principles of the present teachings have been disclosed, the present teachings are not limited to the disclosed embodiments. Instead, this application is intended to cover any variations, uses, or adaptations of the present teachings and use its general principles. Further, this application is intended to cover such departures from the present disclosure that are within known or customary practice in the art to which these teachings pertain.

In the above detailed description, reference is made to the accompanying drawings, which form a part hereof. In the drawings, similar symbols typically identify similar components, unless context dictates otherwise. The illustrative embodiments described in the present disclosure are not meant to be limiting. Other embodiments may be used, and other changes may be made, without departing from the spirit or scope of the subject matter presented herein. It will be readily understood that various features of the present disclosure, as generally described herein, and illustrated in the Figures, can be arranged, substituted, combined, separated, and designed in a wide variety of different configurations, all of which are explicitly contemplated herein.

Aspects of the present technical solutions are described herein with reference to flowchart illustrations and/or block diagrams of methods, apparatuses (systems), and computer program products according to embodiments of the technical solutions. It will be understood that each block of the flowchart illustrations and/or block diagrams, and combinations of blocks in the flowchart illustrations and/or block diagrams, can be implemented by computer readable program instructions.

These computer readable program instructions can be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions can also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the figures illustrate the architecture, functionality, and operation of possible implementations of systems, methods, and computer program products according to various embodiments of the present technical solutions. In this regard, each block in the flowchart or block diagrams can represent a module, segment, or portion of instructions, which includes one or more executable instructions for implementing the specified logical function(s). In some alternative implementations, the functions noted in the blocks can occur out of the order noted in the figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

A second action can be said to be "in response to" a first action independent of whether the second action results directly or indirectly from the first action. The second action can occur at a substantially later time than the first action and still be in response to the first action. Similarly, the second action can be said to be in response to the first action even if intervening actions take place between the first action and the second action, and even if one or more of the intervening actions directly cause the second action to be performed. For example, a second action can be in response to a first action if the first action sets a flag and a third action later initiates the second action whenever the flag is set.

The present disclosure is not to be limited in terms of the particular embodiments described in this application, which are intended as illustrations of various features. Many modifications and variations can be made without departing from its spirit and scope, as will be apparent to those skilled in the art. Functionally equivalent methods and apparatuses within the scope of the disclosure, in addition to those enumerated herein, will be apparent to those skilled in the art from the foregoing descriptions. It is to be understood that this disclosure is not limited to particular methods, reagents, compounds, compositions or biological systems, which can, of course, vary. It is also to be understood that the terminology used herein is for the purpose of describing particular embodiments only, and is not intended to be limiting.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein are generally intended as "open" terms (for example, the term "including" should be interpreted as "including but not limited to," the term "having" should be interpreted as "having at least," the term "includes" should be interpreted as "includes but is not limited to," et cetera). While various compositions, methods, and devices are described in terms of "comprising" various components or steps (interpreted as meaning "including, but not limited to"), the compositions, methods, and devices can also "consist essentially of" or "consist of" the various components and steps, and such terminology should be interpreted as defining essentially closed-member groups.

As used in this document, the singular forms "a," "an," and "the" include plural references unless the context clearly dictates otherwise. Unless defined otherwise, all technical and scientific terms used herein have the same meanings as commonly understood by one of ordinary skill in the art. Nothing in this disclosure is to be construed as an admission that the embodiments described in this disclosure are not entitled to antedate such disclosure by virtue of prior invention.

In addition, even if a specific number is explicitly recited, those skilled in the art will recognize that such recitation should be interpreted to mean at least the recited number (for example, the bare recitation of "two recitations," without other modifiers, means at least two recitations, or two or more recitations). Furthermore, in those instances where a convention analogous to "at least one of A, B, and C, et cetera" is used, in general such a construction is intended in the sense one having skill in the art would understand the convention (for example, "a system having at least one of A, B, and C" would include but not be limited to systems that have A alone, B alone, C alone, A and B together, A and C together, B and C together, and/or A, B, and C together, et cetera). In those instances where a convention analogous to "at least one of A, B, or C, et cetera" is used, in general such a construction is intended in the sense one having skill in the art would understand the convention (for example, "a system having at least one of A, B, or C" would include but not be limited to systems that have A alone, B alone, C alone, A and B together, A and C together, B and C together, and/or A, B, and C together, et cetera). It will be further understood by those within the art that virtually any disjunctive word and/or phrase presenting two or more alternative terms, whether in the description, sample embodiments, or drawings, should be understood to contemplate the possibilities of including one of the terms, either of the terms, or both terms. For example, the phrase "A or B" will be understood to include the possibilities of "A" or "B" or "A and B."

In addition, where features of the disclosure are described in terms of Markush groups, those skilled in the art will recognize that the disclosure is also thereby described in terms of any individual member or subgroup of members of the Markush group.

As will be understood by one skilled in the art, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, et cetera. As a non-limiting example, each range discussed herein can be readily broken down into a lower third, middle third and upper third, et cetera. As will also be understood by one skilled in the art all language such as "up to," "at least," and the like include the number recited and refer to ranges that can be subsequently broken down into subranges as discussed above. Finally, as will be understood by one skilled in the art, a range includes each individual member. Thus, for example, a group having 1-3 components refers to groups having 1, 2, or 3 components. Similarly, a group having 1-5 components refers to groups having 1, 2, 3, 4, or 5 components, and so forth.

Various of the above-disclosed and other features and functions, or alternatives thereof, may be combined into many other different systems or applications. Various presently unforeseen or unanticipated alternatives, modifications, variations or improvements therein may be subsequently made by those skilled in the art, each of which is also intended to be encompassed by the disclosed embodiments.

The invention claimed is:

1. A computer-implemented method for training a generator model of a generative adversarial network (GAN) to remove artifacts from undersampled magnetic resonance imaging (MRI) data, the GAN comprising the generator model and a discriminator model, the method comprising:
    (a) obtaining, by a computer system, the undersampled 3D MRI data from fully-sampled 3D MRI data;
    (b) providing, by the computer system, the undersampled 3D MRI data to the generator model, wherein the generator model is configured to output a generated example in response thereto;
    (c) providing, by the computer system, the generated example and a real example based on the fully-sampled 3D MRI data to the discriminator model;
    (d) applying, by the computer system, adversarial loss, L2 loss, and structural similarity index measure loss to the generator model based on a classification output by the discriminator model;
    (e) repeating, by the computer system, (a)-(d) until the generator model has been trained to remove the artifacts from the undersampled 3D MRI data;
    (f) generating, by the computer system, using the trained generator model, a parameter map for a biomarker from an undersampled MRI data set associated with a patient.

2. The method of claim 1, wherein the undersampled 3D MRI data were created via kspace data undersampling.

3. The method of claim 1, wherein the artifacts comprise at least one of streaking, aliasing, or ghosting.

4. The method of claim 1, wherein the undersampled 3D MRI data were obtained via a Cartesian trajectory.

5. The method of claim 1, wherein the undersampled 3D MRI data were obtained via a non-Cartesian trajectory.

6. The method of claim 1, further comprising:
    generating, by the computer system, using the trained generator model, an image of a patient from an undersampled MR image of the patient.

7. The method of claim 1, wherein the trained generator model is configured to reduce a mean value and a standard deviation of measured values of the biomarker to suppress artificial values for the biomarker.

8. A computer system for training a generator model of a generative adversarial network (GAN) to remove artifacts from undersampled magnetic resonance imaging (MRI) data, the GAN comprising the generator model and a discriminator model, the computer system comprising:
    a processor; and
    a memory coupled to the processor, the memory storing instructions that, when executed by the processor, cause the computer system to:
        (a) obtain the undersampled 3D MRI data from fully-sampled 3D MRI data;
        (b) provide the undersampled 3D MRI data to the generator model, wherein the generator model is configured to output a generated example in response thereto;
        (c) provide the generated example and a real example based on the fully-sampled 3D MRI data to the discriminator model,
        (d) apply adversarial loss, L2 loss, and structural similarity index measure loss to the generator model based on a classification output by the discriminator model;
        (e) repeat (a)-(d) until the generator model has been trained to remove the artifacts from the undersampled 3D MRI data; and
        (f) generate, using the trained generator model, a parameter map for a biomarker from an undersampled MRI data set associated with a patient.

9. The computer system of claim 8, wherein the undersampled 3D MRI data were created via k-space data undersampling.

10. The computer system of claim 8, wherein the artifacts comprise at least one of streaking, aliasing, or ghosting.

11. The computer system of claim 8, wherein the undersampled 3D MRI data were obtained via a Cartesian trajectory.

12. The computer system of claim 8, wherein the undersampled 3D MRI data were obtained via a non-Cartesian trajectory.

13. The computer system of claim 8, wherein the memory stores further instructions that, when executed by the processor, cause the computer system to:

generate, using the trained generator model, an image of a patient from an undersampled MR image of the patient.

14. A non-transitory medium storing program instructions for training a generator model of a generative adversarial network (GAN) to remove artifacts from undersampled magnetic resonance imaging (MRI) data, the GAN comprising the generator model and a discriminator model, the program instructions executable by a processing apparatus to:
  a) obtain the undersampled 3D MRI data from fully-sampled 3D MRI data;
  b) provide the undersampled 3D MRI data to the generator model, wherein the generator model is configured to output a generated example in response thereto;
  c) provide the generated example and a real example based on the fully-sampled 3D MRI data to the discriminator model,
  d) apply adversarial loss, L2 loss, and structural similarity index measure loss to the generator model based on a classification output by the discriminator model;
  (e) repeat (a) (d) until the generator model has been trained to remove the artifacts from the undersampled 3D MRI data; and
  (f) generate, using the trained generator model, a parameter map for a biomarker from an undersampled MRI data set associated with a patient.

15. The medium of claim 14, wherein the undersampled 3D MRI data were created via k-space data undersampling.

16. The medium of claim 14, wherein the undersampled 3D MRI data were obtained via a non-Cartesian trajectory.

17. The medium of claim 14, the program instructions executable by a processing apparatus to:
  generate, using the trained generator model, an image of a patient from an undersampled MR image of the patient.

\* \* \* \* \*